(12) United States Patent
Yasukawa

(10) Patent No.: US 10,483,480 B2
(45) Date of Patent: Nov. 19, 2019

(54) DISPLAY DEVICE

(71) Applicant: Japan Display Inc., Tokyo (JP)

(72) Inventor: Koji Yasukawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/047,076

(22) Filed: Jul. 27, 2018

(65) Prior Publication Data

US 2019/0051854 A1 Feb. 14, 2019

(30) Foreign Application Priority Data

Aug. 14, 2017 (JP) .................................. 2017-156644

(51) Int. Cl.
| | |
|---|---|
| *H01L 29/08* | (2006.01) |
| *H01L 51/50* | (2006.01) |
| *H01L 51/00* | (2006.01) |
| *H01L 51/52* | (2006.01) |
| *H01L 27/32* | (2006.01) |

(52) U.S. Cl.
CPC ...... *H01L 51/5088* (2013.01); *H01L 51/0097* (2013.01); *H01L 51/5056* (2013.01); *H01L 51/524* (2013.01); *H01L 27/3244* (2013.01); *H01L 51/5012* (2013.01); *H01L 51/5096* (2013.01); *H01L 51/5206* (2013.01); *H01L 51/5221* (2013.01); *H01L 51/5281* (2013.01); *H01L 2251/301* (2013.01); *H01L 2251/308* (2013.01); *H01L 2251/5338* (2013.01); *H01L 2251/552* (2013.01); *H01L 2251/558* (2013.01)

(58) Field of Classification Search
CPC .... H01L 51/52; H01L 51/524; H01L 51/5012
See application file for complete search history.

(56) References Cited

U.S. PATENT DOCUMENTS

| | | | | |
|---|---|---|---|---|
| 2005/0005964 | A1* | 1/2005 | Komatsu | H01L 51/0096 136/263 |
| 2008/0231176 | A1* | 9/2008 | Lee | H01L 27/322 313/504 |
| 2010/0025669 | A1* | 2/2010 | Hwang | C07D 209/86 257/40 |
| 2010/0102310 | A1 | 4/2010 | Komatsu et al. | |
| 2014/0021447 | A1* | 1/2014 | Beers | C07D 213/74 257/40 |
| 2016/0190512 | A1* | 6/2016 | Chida | H01L 51/5237 257/40 |
| 2017/0125720 | A1* | 5/2017 | Seo | H01L 51/5203 |
| 2017/0162816 | A1* | 6/2017 | Kim | H01L 51/5088 |

FOREIGN PATENT DOCUMENTS

JP     2010-103374 A     5/2010

* cited by examiner

*Primary Examiner* — Phuc T Dang
(74) *Attorney, Agent, or Firm* — Michael Best & Friedrich LLP

(57) ABSTRACT

A display device including a pixel electrode, a counter electrode, and an organic layer arranged between the pixel electrode and the counter electrode, wherein the organic layer includes a hole injection layer in contact with the pixel electrode, a hole transport layer above the hole injection layer, a light emitting layer and an electron transport layer, the hole injection layer includes an inorganic material, and the inorganic material has a work function of 4.4 eV or less and includes one element or a plurality of elements selected from Na, Mg, K, Rb, Sr, Cs, Ba, Fr, Ca, Yb, Li, Al, Sm, Er and Ho, or a fluoride or an oxide of the elements.

11 Claims, 6 Drawing Sheets

DISPLAY DEVICE

CROSS REFERENCE TO RELATED APPLICATIONS

This application is based upon and claims the benefit of priority from the prior Japanese Patent Application No. 2017-156644, filed on Aug. 14, 2017, the entire contents of which are incorporated herein by reference.

FIELD

One embodiment of the present invention is related to a display device, for example, the present invention is related to an organic EL (Electroluminescence) display device.

BACKGROUND

In an organic EL display device, an organic EL layer is stacked with a hole injection layer, a hole transport layer, a light emitting layer, an electron transport layer and a cathode in this order on an anode. Since the light emitting layer in the organic EL layer described above is formed from different materials for each RGB using a fine metal mask processed with high definition, the light emitting material is not formed between RGB pixels. On the other hand, since a fine metal mask is not used when forming the hole injection layer, the hole transport layer and the electron transport layer, these materials are also formed between each pixel. That is, the organic EL layer which does not use a fine metal mask other than for the light emitting layer is formed uniformly over the entire light emitting region of a display. Since the organic layer which forms the organic EL layer has low adhesion, a sheet on an element side where a TFT circuit or the like is formed and a sheet on a sealing plate side opposite the sheet on the element side easily peel with the organic EL layer as a boundary, and there is a problem whereby durability against physical stimulation is poor.

In addition, attempts have been made to improve adhesion by forming the entire layer of the organic EL layer using a fine metal mask, arranging an area where the organic EL layer is not deposited on a bank, and contacting a layer formed in an upper layer than the organic EL layer, for example, a sealing film and a bank surface. However, since the adhesion between the bank which is a resin material and the sealing film which is a silicon-based inorganic film is not very high, it is difficult to maintain sufficient strength.

In order to solve this problem, a technique has been disclosed (for example, Japanese Laid Open Patent Application No. 2010-103374) in which a hole injection layer is formed from a mixture of molybdenum oxide and tungsten oxide, hole injection performance and the flatness of the hole injection layer surface are improved, and it possible to manufacture an organic EL element having a low drive voltage and high light emission efficiency thereby making it easy to increase the size and achieve mass production of the organic EL element.

SUMMARY

A display device according to one embodiment of the present invention includes a pixel electrode, a counter electrode, and an organic layer arranged between the pixel electrode and the counter electrode, wherein the organic layer includes a hole injection layer in contact with the pixel electrode, a hole transport layer above the hole injection layer, a light emitting layer and an electron transport layer, the hole injection layer includes an inorganic material, and the inorganic material has a work function of 4.4 eV or less and includes one element or a plurality of elements selected from Na, Mg, K, Rb, Sr, Cs, Ba, Fr, Ca, Yb, Li, Al, Sm, Er and Ho, or a fluoride or an oxide of these elements.

DESCRIPTION OF EMBODIMENTS

Figure 1:
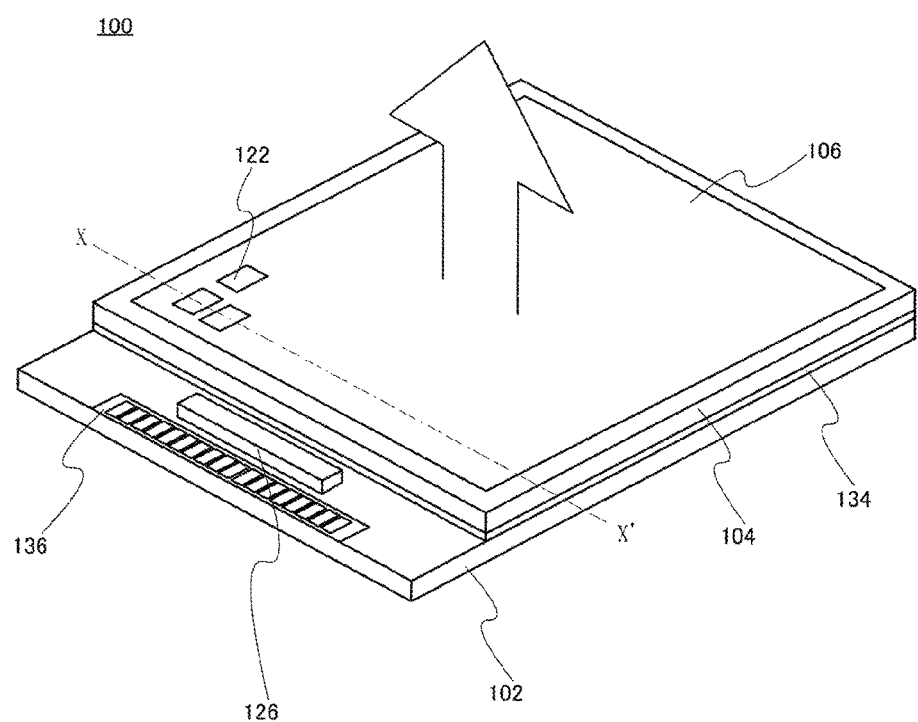
FIG. 1 is perspective view diagram showing a structure of a display device related to one embodiment of the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto (or a numeral followed by a, b, etc.), and detailed descriptions thereof may be omitted. The words "first", "second" and the like provided for components are used merely to distinguish the components from each other, and do not have any further meaning unless otherwise specified.

In the specification and the claims, an expression that a component or a region is "on" another component or region encompasses a case where such a component or region is in direct contact with the other component or region and also a case where such a component is above or below the other component or region, namely, a case where still another component or region is provided between such a component or region and the other component or region, unless otherwise specified. In the following description, unless otherwise specified, the side on which a display element is provided with respect to a substrate as seen in a cross-sectional view will be referred to as "above", and the opposite side will be referred to as "below".

In a practical application of an organic EL display device, peeling strength of the organic EL layer is not necessarily sufficient, for example, in a sheet shaped display device which uses an organic EL element, the bending strength resistance of a substrate is weak and a problem is generated whereby film peeling occurs at the organic EL layer part and a non-light emitting area is generated.

Below, one embodiment of the present invention discloses a display device with increased peeling strength of an organic EL display device.

<Structure of Organic EL Display Device>

Figure 2:
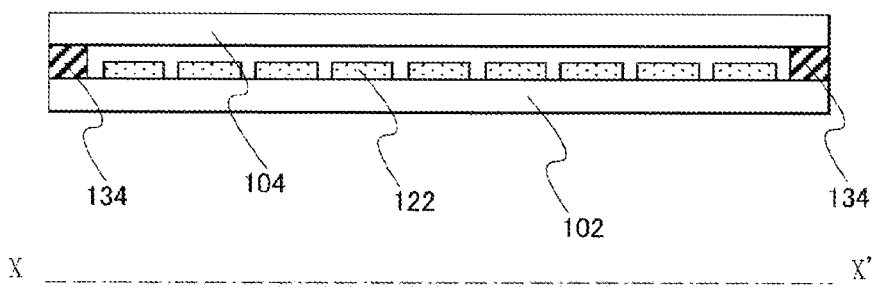
FIG. 2 is a cross-sectional diagram showing a structure of the display device related to one embodiment of the present invention.
Figure 3:
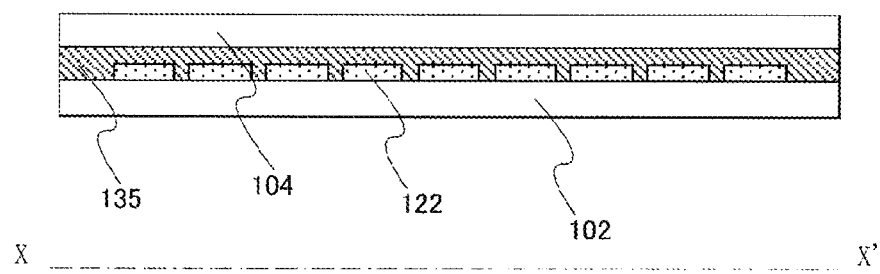
FIG. 3 is a cross-sectional diagram showing a structure of the display device related to one embodiment of the present invention.
Figure 4:
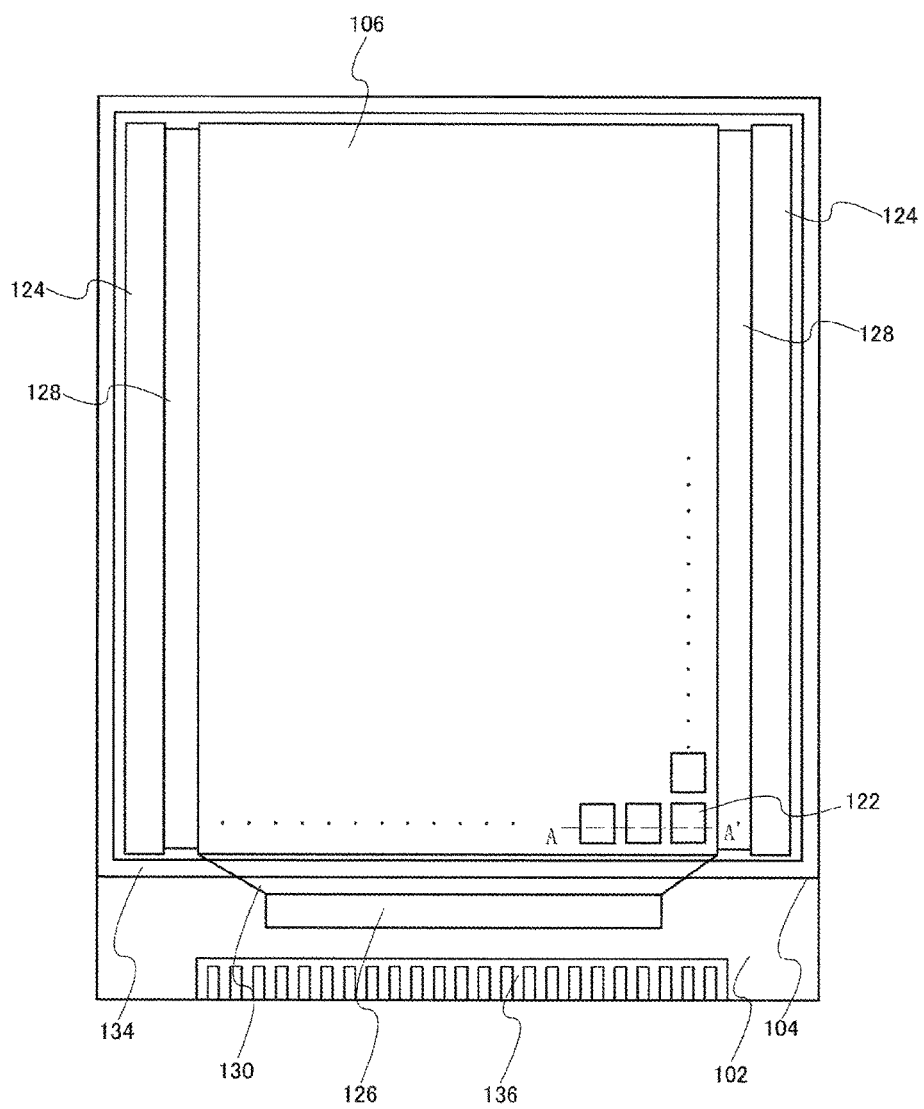
FIG. 4 is a planar view diagram showing a structure of the display device related to one embodiment of the present invention.

FIG. 1 is perspective view diagram showing a structure of an organic EL display device related to one embodiment of the present invention. FIG. 2 and FIG. 3 are cross-sectional diagrams showing a structure of an organic EL display device related to one embodiment of the present invention. FIG. 4 is a planar view diagram showing a structure of an organic EL display device related to one embodiment of the present invention. A schematic structure of an organic EL display device 100 related to one embodiment of the present invention is explained while referring to FIG. 1 to FIG. 4.

As is shown in FIG. 1, in the organic EL display device 100, a pixel region 106 is arranged on a first substrate 102. The pixel region 106 is configured by arranging a plurality of pixels 122 in a matrix shape. A second substrate 104 is arranged as a sealing member on the upper surface of the pixel region 106. As is shown in FIG. 2, the second substrate 104 is fixed to the first substrate 102 by a sealing member 134 which surrounds the pixel region 106. The pixel region 106 formed on the first substrate 102 is sealed so as not to be exposed to the air by the second substrate 104 which is a sealing member and the sealing member 134. The sealing method of the pixel region 106 is not particularly limited thereto and a passivation film may be directly formed so as to cover the pixel region 106 arranged on the first substrate 102 without arranging the second substrate 104. In addition, when fixing the first substrate 102 and the second substrate 104 together, as is shown in FIG. 3, instead of the sealing member 134 surrounding the pixel region 106, the pixel region 106 may be entirely covered and a filler 135 which fills a gap between the first substrate 102 and the second substrate 104 may be used. In addition, although not shown in FIG. 2, a region surrounded by the first substrate 102, the second substrate 104 and the sealing member 134 may be filled with a filler similar to FIG. 3.

The first substrate 102 and the second substrate 104 may be formed using polyimide. The first substrate 102 and the second substrate 104 may be formed using another resin material as long as the substrate has sufficient flexibility as a sheet display. In addition, the second substrate 104 may be an optical film such as a polarizer, retardation film or an antireflection film and the like.

The first substrate 102 may be arranged with a three-layer stacked structure of a silicon oxide film, a silicon nitride film and a silicon oxide film (not shown in the diagram) as an undercoat. The silicon oxide film of the lowest layer may be arranged in order to improve adhesion to a substrate. The silicon nitride film of the middle layer may be arranged as a blocking film of moisture and impurities from the outside. The silicon oxide film of the uppermost layer may be arranged as a blocking film for ensuring hydrogen atoms included in the silicon nitride film from diffusing to the semiconductor layer side. The present embodiment is not particularly limited to this structure and may be further stacked or may be a single layer or a two-layer stacked structure.

A terminal region 136 is arranged at one end part of the first substrate 102. The terminal region 136 is arranged on the outer side of the second substrate 104. A connection terminal of the terminal region 136 forms a contact point with a wiring substrate connecting a device which outputs an image signal or a power supply and the like, and the organic EL display device 100. The first substrate 102 is arranged with a first drive circuit 124 and a second drive circuit 126 for outputting an image signal input from the terminal region 136 to the pixel region 106. Although the terminal region 136 is arranged at one location in FIG. 1, a plurality of terminals region 136 may also be arranged or may be arranged on another side of the first substrate 102.

FIG. 4 shows a form in which the first drive circuit 124 and the second drive circuit 126 are arranged in a region on the outer side the pixel region 106 in the first substrate 102. The first drive circuit 124 outputs a scanning signal to the pixel region 106, and the second drive circuit 126 outputs an image signal to the pixel region 106. The pixel region 106 and the first drive circuit 124 and the second drive circuit 126 are connected to each other by wiring (not shown in the diagram). In addition to the pixel 122, a wiring called a scanning line and an image signal line are arranged in the pixel region 106. Each pixel 122 in the pixel region 106 is connected to the first drive circuit 124 and the second drive circuit 126 by these wirings. For example, the first drive circuit 124 is a drive circuit which outputs a scanning signal to the pixel region 106, and the second drive circuit 126 is a drive circuit which outputs an image signal to the pixel region 106. FIG. 4 shows a form in which a first wiring region 128 is arranged between the pixel region 106 and the first drive circuit 124 and a second wiring region 130 is arranged between the pixel region 106 and the second drive circuit 126.

Figure 5:
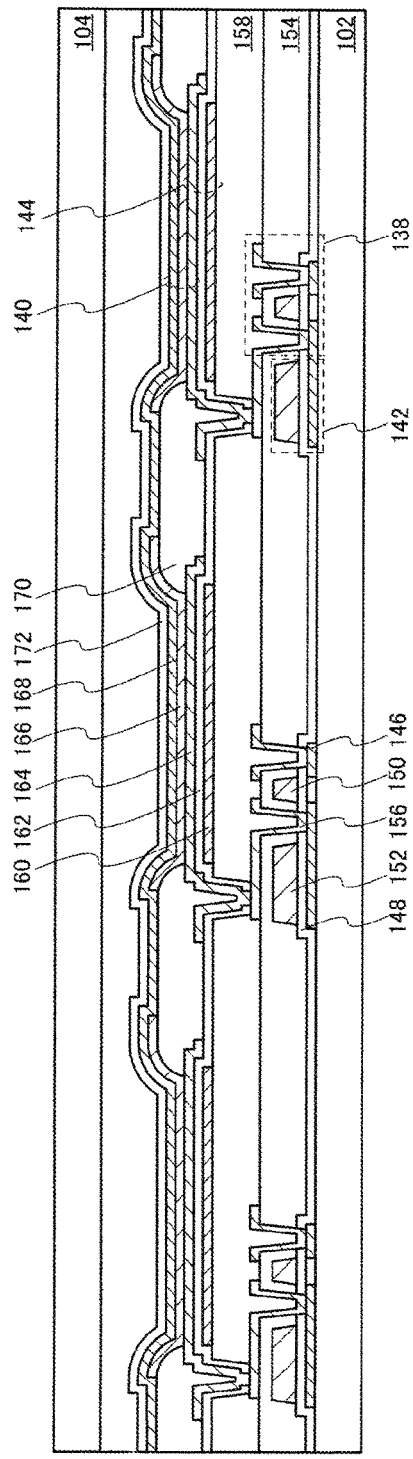
FIG. 5 is a cross-sectional diagram showing a structure of the display device related to one embodiment of the present invention.

FIG. 5 is a cross-sectional diagram showing a structure of an organic EL display device according to the present embodiment. The structure of the pixel region 106 according to the present embodiment is explained while referring to FIG. 5.

A plurality of pixels 122 are arranged in a matrix shape in the pixel region 106. FIG. 5 is a cross-sectional schematic diagram of the pixel region 106 along the line A-A' shown in FIG. 4. The pixel 122 includes a circuit element layer. The circuit element layer in this embodiment has a multilayer structure including a semiconductor layer 146, a gate insulating layer 148, a gate electrode 150, a first capacitor electrode 152, a first insulating layer 154, a source/drain electrode 156, a second insulating layer 158, a second capacitor electrode 160, a third insulating layer 162, a pixel electrode 164, an organic layer 166, a counter electrode 168 and a bank layer 170.

Each of the plurality of pixels 122 in the pixel region 106 includes a transistor 138, a light emitting element 140, a first capacitor element 142 and a second capacitor element 144. The light emitting element 140 is connected to the transistor 138. The transistor 138 controls light emission of the light emitting element 140. The first capacitor element 142 holds a gate potential of the transistor 138, and the second capacitor element 144 holds a potential of the pixel electrode 164.

As is shown in FIG. 5, each of the plurality of pixels 122 has a transistor 138 for each pixel. The transistor 138 has a structure in which a semiconductor layer 146, a gate insulating layer 148 and a gate electrode 150 are stacked.

The semiconductor layer 146 is formed from amorphous or polycrystalline silicon or an oxide semiconductor and the like. The gate insulating layer 148 is formed from a silicon oxide film and the like. The gate electrode 150 may have a structure (first wiring) in which a titanium (Ti) layer and an aluminum (Al) layer are stacked, or a single layer or stacked layer structure using molybdenum (Mo) or tungsten (W).

In addition to the gate electrode 150 of the transistor 138, the first wiring is also used in the formation of the first capacitor electrode 152 which forms the first capacitor element 142. The source/drain electrode 156 (second wiring) is arranged above on an upper layer of the gate electrode 150 interposed by the first insulating layer 154. In the present embodiment, the second wiring is formed by adopting a three-layer stacked structure of a Ti layer, an Al layer and a Ti layer. The first insulating layer 154 may be formed by stacking a silicon nitride film and a silicon oxide film which serve as an interlayer insulating film.

The first capacitor element 142 is formed by the first capacitor electrode 152 and the semiconductor layer 146 formed from a conductive layer on the same layer as the first insulating layer 154 and the gate electrode 150. Lead wiring is formed by wiring in the same layer as the second wiring. The lead wiring extends to the end part of the periphery edge of the substrate and forms a terminal which subsequently connects a flexible printed substrate and a drive circuit. The lead wiring may also be formed by the same layer wiring as the first wiring.

A second insulating layer 158 is arranged as a planarization layer on an upper layer of the source/drain electrode 156. The second insulating layer 158 buries unevenness of the first insulating layer 154 due to the shapes of a contact hole arranged in the source/drain electrode 156 and the first insulating layer 154, and the shape of the gate electrode 150 and the semiconductor layer 146, and also has a roughly flat surface. The second insulating layer 158 may have a planarized surface formed by an etching process or chemically mechanical polishing the surface of the inorganic insulating layer, or a levelled planarized surface obtained by applying or depositing a composition including a precursor such as acrylic or polyimide.

A conductive layer (third wiring) is arranged above the second insulating layer 158. This conductive layer may be arranged in a three-layer stacked structure of a Mo layer, an Al layer and a Mo layer, and it is used in the formation of periphery lead wiring and a second capacitor electrode 160 additionally arranged within a pixel. A third insulating layer 162 is arranged on an upper layer side of the second capacitor electrode 160. The third insulating layer 162 covers the second capacitor electrode 160 and is used as a dielectric layer of the second capacitor element 144. A conductive layer which serves as the pixel electrode 164 is formed on an upper layer side of the third insulating layer 162. Here, the pixel electrode 164 is formed as a reflective electrode and has a three-layer stacked structure of an indium tin oxide (ITO) layer, a silver (Ag) layer and an ITO layer. The second capacitor element 144 is formed in a region where the pixel electrode 164, the third insulating layer 162 and the second capacitor electrode 160 overlap in the pixel 122. In the pixel electrode 164, indium zinc oxide (IZO) may be used instead of ITO.

A light emitting element 140 is arranged on an upper surface of the second insulating layer 158. Each of the plurality of pixels 122 has the light emitting element 140 for each pixel. The light emitting element 140 has a structure in which a pixel electrode 164, an organic layer 166 and a counter electrode 168 which are electrically connected to the transistor 138 are stacked. The organic layer 166 may emit light of each color of red (R), green (G), and blue (B), or may emit white light.

The pixel electrode 164 is arranged for each pixel on an upper surface of the second insulating layer 158. The pixel electrode 164 is arranged on an upper layer of the source/drain electrode 156 interposed by the second insulating layer 158.

In addition, a bank layer 170 is arranged on an upper surface of the pixel electrode 164 so as to cover a periphery part of the pixel electrode 164 and to expose an inner region. In other words, a bank layer 170 which both covers an end part and includes an opening part which exposes the upper surface of the pixel electrode 164 is arranged on the upper surface of the pixel electrode 164. It is preferred that the open end of the bank layer 170 has a gentle taper shape. If the open end has a steep shape, coverage failure of the organic layer 166 formed later occurs. Furthermore, the bank layer 170 buries a contact hole arranged in the second insulating layer 158. By arranging the bank layer 170 formed from an insulating material, it is possible to prevent the counter electrode 168 and the pixel electrode 164 from short-circuiting at the end part of the pixel electrode 164. Furthermore, it is possible to securely insulate adjacent pixels 122. The bank layer 170 may be formed from a photosensitive organic resin material. A photosensitive acrylic resin or a photosensitive polyimide resin and the like is used as the photosensitive organic resin material.

An organic layer 166 is arranged on the upper surface of the bank layer 170 so as to cover the opening part. The organic layer 166 is arranged for each pixel on the upper surface of the pixel electrode 164 and the bank layer 170. In another embodiment, the organic layer 166 may be formed on the entire surface covering the display region. In the case of solid formation, a structure is possible to obtain monochromatic light, for example, white light in all the pixels and extract a desired color wavelength part using a color filter (not shown in the diagram). The organic layer 166 may be formed by vapor deposition or be formed by coating in a state of being dispersed in a solvent.

The counter electrode 168 is arranged to cover the upper surface of the bank layer 170 from the upper surface of the organic layer 166 and is arranged as a common electrode across a plurality of pixels 122. Here, since a top emission structure is adopted, the counter electrode 168 is formed from a transparent conductive material, IZO being one example. According to the formation sequence of the organic layer 166 mentioned above, the pixel electrode 164 serves as an anode and the counter electrode 168 serves as a cathode. The counter electrode 168 is formed across the display region and across a contact part arranged in the vicinity of the display region and is connected to a lower conductive layer at the contact part and is finally drawn out to the terminal part.

A sealing layer 172 is arranged above the light emitting element 140. The sealing layer 172 covers the entire surface of the light emitting element 140 and is arranged in order to prevent the entry of moisture and the like. It is preferred that the sealing layer 172 have a light-transmitting property using a film such as silicon nitride or aluminum oxide and the like. In addition, a filler may also be arranged between the sealing layer 172 and the second substrate 104. In addition, a part of the sealing layer 172 may include an organic layer. For example, the sealing layer 172 may have a stacked layer structure such as an inorganic layer/organic layer/inorganic layer. In the present embodiment, a stacked structure of a silicon nitride film, a silicon oxide film, an organic resin and a silicon nitride film is adopted as the stacked layer structure including a silicon nitride film.

When white light is emitted from the light emitting element 140, a light shielding layer and a color filter layer may also be arranged on the second substrate 104. The color filter layer is arranged at a position facing each of the plurality of pixels 122. The light shielding layer is arranged at a position which partitions each of the plurality of pixels 122. By arranging the color filter layer, when white light is emitted from the light emitting element 140, the organic EL display device 100 can perform color display. Furthermore, an optical film such as a polarizer and a retardation film may also be arranged on the second substrate 104. The optical film covers the plurality of pixels 122 and is arranged on the outer side surface of the second substrate 104. The optical film is arranged in order to suppress any deterioration in visibility due to external light incident on the organic EL display device 100 being reflected by the pixel electrode 164.

Furthermore, according to necessity, a cover glass or a touch panel substrate and the like may also be arranged on the sealing layer 172. In this case, a filler using a resin or the like may be interposed in order to fill a gap with the organic EL display device.

Figure 6:
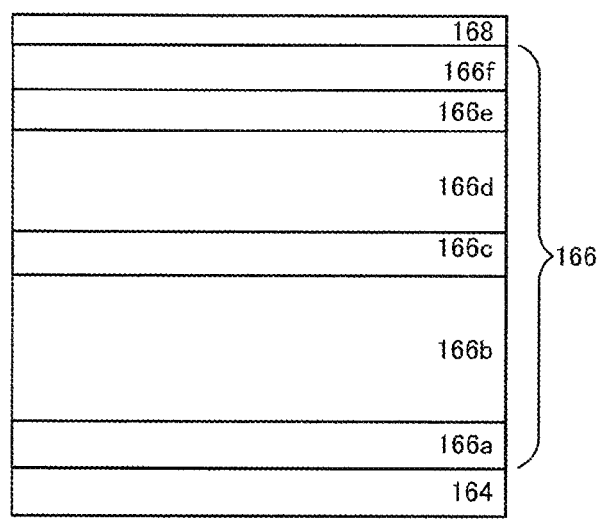
FIG. 6 is a cross-sectional diagram showing a structure of the display device related to one embodiment of the present invention.

Next, a structure of the light emitting element 140 according to the present embodiment is explained in more detail while referring to FIG. 6. FIG. 6 is a cross-sectional diagram showing the structure of the organic EL display device according to the present embodiment. FIG. 6 is a cross-sectional diagram of the light emitting device 140 shown in FIG. 5.

The light emitting element 140 has a structure in which a pixel electrode 164, an organic layer 166 and a counter electrode 168 which are electrically connected to the transistor 138 are stacked. The light emitting element 140 is a two-terminal element, and light emission of the organic layer 166 including a light emitting layer 166*d* which is sandwiched between both electrodes is controlled by controlling the value of a current flowing between the pixel electrode 164 and the counter electrode 168. In the present embodiment, the light emitting element 140 is shown having a top emission structure in which light emitted from the light emitting layer 166*d* is emitted toward the counter electrode 168. In another embodiment, the light emitting element 140 may have a bottom emission type structure.

It is preferred to use ITO or IZO which have excellent hole injection properties on the surface of the pixel electrode 164 or the surface where the pixel electrode 164 is in contact with the hole injection layer 166*a*. ITO and IZO are one type of transparent conductive material, and although they have a high transmittance in the visible light band, reflectance is extremely low. Therefore, in order to add a function for reflecting light to the pixel electrode 164, the pixel electrode 164 is preferred to form with an entire reflective surface by stacking a metal layer such as Al or silver (Ag) on a transparent conductive material formed from ITO or IZO and the like. However, the present embodiment is not limited thereto, and as is shown in FIG. 5, the third insulating layer 162 and the second capacitor electrode 160 may be arranged under the pixel electrode 164 which is formed from ITO or IZO and the like to form the second capacitor element 144, and the second capacitor electrode 160 may be formed from a metal material so as to combine the function of entire reflective surface. The pixel electrode 164 may be a conductive film having excellent hole injection properties and an entire reflective surface. The entire reflective surface of the pixel electrode 164 is arranged on a side opposite to the organic layer 166. In the case of the stacked structure described above, the total thickness of the pixel electrode 164 is preferred to be in the range of 50 nm to 300 nm, and the thickness of the transparent conductive material formed from ITO or IZO and the like particularly when it serves as the outermost surface is preferred to be in the range of 1 nm to 20 nm.

In the present embodiment, the pixel electrode 164 is preferred to have a surface roughness Ra of 20 nm or more and a PV value (Peak to Valley) between protrusions and recesses on the surface at about twice the surface roughness Ra, and in this is preferred to be 40 nm or more. Film peeling often occurs at a boundary between the pixel electrode 164 and the organic layer 166. As a result, by setting the surface roughness Ra of the pixel electrode 164 to 20 nm or more and the PV value between the protrusions and recesses on the surface of the pixel electrode 164 to 40 nm or more, it is possible to improve adhesion between the pixel electrode 164 and the organic layer 166. Therefore, by using the present embodiment, it is possible to manufacture a display device with high peeling strength.

The counter electrode 168 is preferred to be formed from a semitransparent conductive film having excellent hole injection properties and semi-transparent properties such as a magnesium-silver alloy (MgAg alloy) or stacked films of a magnesium-silver alloy and silver. Here, the semi-transparency of the semi-transparent conductive film indicates that transmittance is in the range of 20% or more and 90% or less. Light which did not pass through is reflected. Here, the surface of the counter electrode 168 on the organic layer 166 side is set as a semi-reflective surface. Although the thickness of the counter electrode 168 is not particularly limited as long as it satisfies the transmittance described above, in the case where a MgAg alloy is used, the thickness is preferred to be in the range of 5 nm to 30 nm.

The organic layer 166 is formed using a low molecular or high molecular weight organic material. In the case where a low molecular weight organic material is used, in addition to the light emitting layer 166*d* including a light emitting organic material, a structure may be adopted in which the organic layer 166 includes a hole injection layer 166*a*, a hole transport layer 166*b*, an electron blocking layer 166*c*, a hole blocking layer 166*e* and an electron transport layer 166*f* and the like. In the present embodiment, the organic layer 166 is stacked in sequence with the electron blocking layer 166*c*, the hole transport layer 166*b* and the hole injecting layer 166*a* in the direction of the pixel electrode 164 sandwiching the light emitting layer 166*d* and is stacked in sequence with the hole blocking layer 166*e* and the electron transport layer 166*f* in the direction of the counter electrode 168 sandwiching the light emitting layer 166*d*. Although not shown in the diagram, the organic layer 166 may be added with an electron injection layer between the counter electrode 168 and the electron transport layer 166*f*.

In the present embodiment, an inorganic material or a material obtained by co-evaporating an inorganic material and an organic material is used as the material of the hole injection layer 166*a*. It is preferred that the inorganic material has a work function of 4.4 eV or less and is one or a plurality of elements selected from, for example, Na, Mg, K, Sr, Cs, Ba, Fr, Ca, Rb, Yb, Li, Al, Sm, Er and Ho or a fluoride or oxide of these elements. The thickness of the hole injection layer 166*a* is preferred to be in the range of 1 nm to 20 nm.

As the hole transport material used for the hole transport layer 166*b*, for example, benzidine or a derivative thereof, styrylamine or a derivative thereof, triphenylmethane or a derivative thereof, porphyrin or a derivative thereof, triazole or a derivative thereof, imidazole or a derivative thereof, oxadiazole or a derivative thereof, polyarylalkane or a derivative thereof, phenylenediamine or a derivative thereof, arylamine or a derivative thereof, oxazole or a derivative thereof, anthracene or a derivative thereof, fluorenone or a derivative thereof, hydrazone or a derivative thereof, stilbene or a derivative thereof, phthalocyanine or a derivative thereof, polysilane compounds, vinylcarbazole compounds, thiophene compounds, or heterocyclic conjugated monomers such as aniline compounds and the like, oligomers and polymers and the like are exemplified.

Although specific examples of such hole transport materials include α-naphthylphenyl diamine (αNPD), porphyrin, metal tetraphenylporphyrin, metal naphthalocyanine, 4,4', 4''-trimethyltriphenylamine, 4,4',4''-tris (3-methylphenyl phenylamino) triphenylamine (m-MTDATA), N,N,N',N''-tetrakis (p-tolyl) p-phenylenediamine, N,N,N',N'-tetraphenyl-4,4'-diaminobiphenyl, N-phen ylcarbazole, 4-di-p-tolylaminostilbene, poly (paraphenylenevinylene), poly (thiophenevinylene), poly (2,2'-thienylpyrrole), and the like, the present embodiment is not limited thereto.

As a material of the hole transport layer 166b, for example, it is possible to use N, N-di (naphthalene-1-yl)-N, N-diphenylbenzidine (NPB: N, N-di (naphthalene-1-yl)-N or N-diphenyl-benzidene) shown in the formula 1 below. The thickness of the hole transport layer 166b is preferred to be about 210 nm.

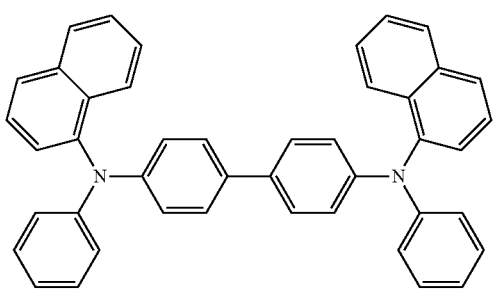

(1)

It is possible to use for example, HTEB02 or HTEB04 manufactured by Kanto Kagaku Co., Ltd., as the material of the electron blocking layer 166c. The thickness of the electron blocking layer 166c is preferred to be about 10 nm.

The light emitting layer 166d is formed by combining a host material which is appropriately required from among the hole transport material and electron transport material described above and a dual charge-transport material. For example, it is possible to use 4,4'-N, N'-dicarbazole-biphenyl (CBP: 4,4'-N, N'-dicarbozole-biphenyl) represented by the chemical formula 2 below or a light emitting host BH140 manufactured by IDEMITSU Kosan Co., Ltd. as the host material. Furthermore, it is possible to include a necessary dopant material from among a red light emitting material, a green light emitting material or a blue light emitting material according to the arrangement of pixels. It is preferred that the thickness of the light emitting layer 166d is about 30 nm.

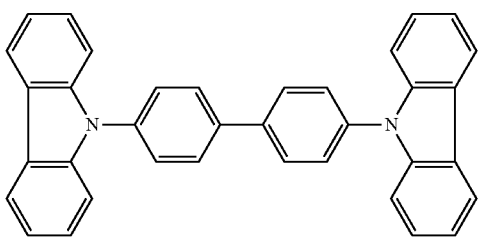

(2)

For example, it is possible to exemplify a cyclopentadiene derivative, a tetraphenyl butadiene derivative, a triphenylamine derivative, an oxadiazole derivative, a bathophenanthroline derivative, a pyrazoloquinoline derivative, a styrylbenzene derivative, a styrylarylene derivative, an aminostyryl derivative, a silole derivative, a thiophene ring compound, a pyridine ring compound, a perinone derivative, a perylene derivative, an oligothiophene derivative, a coumarin derivative, a rubrene derivative, a quinacridone derivative, a squarylium derivative, a porphyrin derivative, a styryl type dye, a tetracene derivative, a trifluoperazine derivative, an anthracene derivative, a diphenylanthracene derivative, a pyrene derivative, a carbazole derivatives, an oxadiazole dimer, a virazoline dimer, an aluminum quinolinol, a benzoquinolinol beryllium complex, a benzoxazole zinc complex, a benzothiazole zinc complex, an azomethyl zinc complex, a porphyrin zinc complex, an europium complex, an iridium complex, a metal such as Al, Zn, Be, Pt, Pt, Ir, Tb, Eu, Dy, and the like as a central metal, and metal complexes having oxadiazole, thiadiazole, phenylpyridine, phenylbenzimidazole, or quinoline structure and the like as a ligand as the red light emitting material.

One or a plurality of materials appropriately selected from the materials described above are used as the green light emitting material.

In addition, although perylene can be exemplified as a specific example of the blue light emitting material, it is not limited thereto. For example, BD102 manufactured by IDEMITSU Kosan Co., Ltd. can be used as the blue light emitting material. The light emission spectrum of the blue light emitting material is in a wavelength range of 440 nm or more and 470 nm or less. It is possible to improve the extraction efficiency of the light emitted by the organic layer 166 including the blue light emitting material.

For example, 4,4'-N,N'-dicarbazole-biphenyl (CBP: 4,4'-N, N'-dicarbazole-biphenyl) represented by the chemical formula 3 below, or 2, 9-dimethyl-4,7-diphenyl-1,10-phenanthroline (BCP: 2,9-dimethyl-4,7-diphenyl-1,10-phenanthroline) can be used as the material of the hole blocking layer 166e. The thickness of the hole blocking layer 166e is preferred to be about 10 nm.

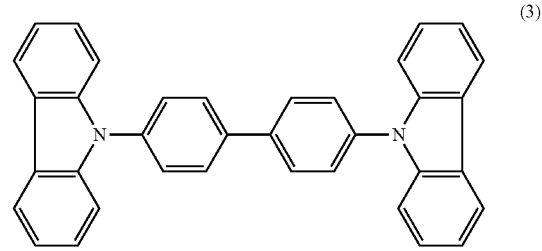 [SMILES: c1ccc2c(c1)c1ccccc1n2-c1ccc(-c2ccc(-n3c4ccccc4c4ccccc43)cc2)cc1]

(3)

Although materials which can be used as an electron transport material which is used for the electron transport layer 166f and an electron injection layer are exemplified by 8-hydroxyquinoline aluminum (Alq$_3$), 8-hydroxymethylquinoline aluminum, anthracene, naphthalene, phenanthrene, pyrene, chrysene, perylene, Butadiene, coumarin, acridine, stilbene and derivatives thereof and the like, the present embodiment is not limited thereto.

For example, it is possible to use 5% by volume of lithium added to 2,4-bis (4-biphenyl)-6-(4'-(2-pyridyl)-4-diphenyl)-[1,3,5] triazine (MPT: 2,4-bis (4-biphenyl)-6-(4'-(2-Pyridinyl)-4-biphenyl)-[1,3,5] triazine) represented in the chemical formula 4 below as a material of the electron transport layer 166f. The thickness of the electron transport layer 166f is preferred to be about 20 nm. By adopting such a structure, it is possible to provide an organic EL display device 100 including a light emitting element with improved light extraction efficiency.

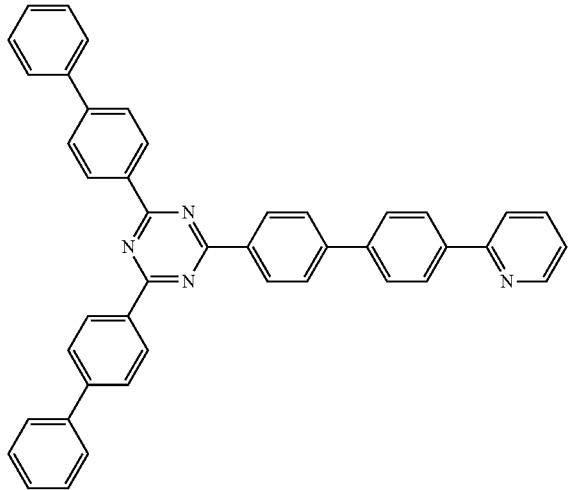

(4)

The structures of the light emitting element 140 and the organic EL display device 100 according to the present embodiment were explained above. The light emitting element 140 according to the present embodiment has a work function of 4.4 eV or less and by using an inorganic material such as Na, Mg, K, Rb, Sr, Cs, Ba, Fr, Ca, Yb, Li, Al, Sm, Er, or Ho or a fluoride or an oxide thereof, or a material obtained by co-depositing the inorganic material and the organic material for the hole injection layer 166a of the organic layer 166, it is possible to improve adhesion between the pixel electrode 164 and the organic layer 166. By adopting such a structure, it is possible to provide the organic EL display device 100 including the light emitting element 140 with improved peeling strength.

EXAMPLES

Next, the measurements below were performed in order to evaluate characteristics using the organic EL display device 100 including the light emitting element according to the examples and comparative examples.
<Repeated Bending Strength Peeling Resistance>
Repeated bending strength peeling resistance at a bending radius of R10 mm was calculated.
The structure of the light emitting element 140 according to the example and the comparative example is as follows.

Example 1

The material and film thickness of the organic layer 166 of the light emitting element 140 according to Example 1 are as follows.
Pixel electrode 164: ITO/Ag/ITO, outermost surface ITO film thickness 10 nm, Ra 20 nm, PV value 40 nm
Hole injection layer 166a: single layer of MgF2, 1 nm
Hole transport layer 166b: 120 nm
Electron blocking layer 166c: 10 nm
Light emitting layer 166d: 40 nm
Hole blocking layer 166e: 10 nm
Electron transport layer 166f: 20 nm
Counter electrode 168: MgAg alloy, 15 nm Example 2

The material and film thickness of the organic layer 166 of the light emitting element 140 according to Example 2 are as follows.
Pixel electrode 164: ITO/Ag/ITO, outermost surface ITO film thickness 10 nm, Ra 20 nm, PV value 40 nm
Hole injection layer 166a: Amine based organic material and mixed layer of MgF2 (5 vol %), 5 nm
Hole transport layer 166b: 120 nm
Electron blocking layer 166c: 10 nm
Light emitting layer 166d: 40 nm
Hole blocking layer 166e: 10 nm
Electron transport layer 166f: 20 nm
Counter electrode 168: MgAg alloy, 15 nm Comparative Example 1

The material and film thickness of the organic layer 166 of the light emitting element 140 according to Comparative Example 1 are as follows.
Pixel electrode 164: ITO/Ag/ITO, outermost surface ITO film thickness 10 nm, Ra 10 nm, PV value 20 nm
Hole injection layer 166a: Single layer of MgF2, 1 nm
Hole transport layer 166b: 120 nm
Electron blocking layer 166c: 10 nm
Light emitting layer 166d: 40 nm
Hole blocking layer 166e: 10 nm
Electron transport layer 166f: 20 nm
Counter electrode 168: MgAg alloy, 15 nm Comparative Example 2

The material and film thickness of the organic layer 166 of the light emitting element 140 according to Comparative Example 2 are as follows.
Pixel electrode 164: ITO/Ag/ITO, outermost surface ITO film thickness 10 nm, Ra 10 nm, PV value 20 nm
Hole injection layer 166a: Amine based organic material and mixed layer of MgF2 (5 vol %), 5 nm
Hole transport layer 166b: 120 nm
Electron blocking layer 166c: 10 nm
Light emitting layer 166d: 40 nm
Hole blocking layer 166e: 10 nm
Electron transport layer 166f: 20 nm
Counter electrode 168: MgAg alloy, 15 nm Comparative Example 3

The material and film thickness of the organic layer 166 of the light emitting element 140 according to Comparative Example 3 are as follows.
Pixel electrode 164: ITO/Ag/ITO, outermost surface ITO film thickness 10 nm, Ra 10 nm, PV value 20 nm
Hole injection layer 166a: HAT-CN, 5 nm
Hole transport layer 166b: 120 nm
Electron blocking layer 166c: 10 nm
Light emitting layer 166d: 40 nm
Hole blocking layer 166e: 10 nm
Electron transport layer 166f: 20 nm
Counter electrode 168: MgAg alloy, 15 nm Comparative Example 4

The material and film thickness of the organic layer 166 of the light emitting element 140 according to Comparative Example 4 are as follows.

Pixel electrode 164: ITO/Ag/ITO, outermost surface ITO film thickness 10 nm, Ra 10 nm, PV value 20 nm
Hole injection layer 166a: HAT-CN, 5 nm
Hole transport layer 166b: 120 nm
Electron blocking layer 166c: 10 nm
Light emitting layer 166d: 40 nm
Hole blocking layer 166e: 10 nm
Electron transport layer 166f: 20 nm
Counter electrode 168: MgAg alloy, 15 nm The results of the above measurements are shown in Table 1.

TABLE 1

| | Hole Injection Layer Structure | Hole Injection Layer Material | Hole Injection Layer Film Thickness (nm) | Pixel Electrode Ra (nm) | Pixel Electrode P-V (nm) | Repeated Bending Strength Peeling Resistance (curvature radius R10 mm) |
|---|---|---|---|---|---|---|
| Example 1 | Single layer | MgF2 | 1 | 20 | 10 | No defects up to 100,000 times |
| Example 2 | Mixed layer | Amine based organic material and MgF$_2$ (5% Vol) | 5 | 20 | 10 | No defects up to 100,000 times |
| Comparative Example 1 | Single layer | MgF2 | 1 | 10 | 5 | Defects occur at 2000 times |
| Comparative Example 2 | Mixed layer | Amine based organic material and MgF$_2$ (5% Vol) | 5 | 10 | 5 | Defects occur at 2000 times |
| Comparative Example 3 | — | HAT-CN | | 10 | 5 | Defects occur at 450 times |
| Comparative Example 4 | — | HAT-CN | | 20 | 10 | Defects occur at 800 times |

As is shown in Table 1, in the light emitting element 140, the hole injection layer 166a is a single layer of MgF$_2$ or a mixed layer of an amine based organic material and MgF$_2$, and by setting the surface roughness Ra of the pixel electrode 164 to 20 nm or more and the PV value to 40 nm or more, no defects occurred up to 100,000 times of a repeated bending evaluation. In Comparative Example 3 which is a conventional structure which does not use a material having a work function of 4.4 eV or less or use an inorganic material such as Na, Mg, K, Rb, Sr, Cs, Ba, Fr, Ca, Yb, Li, Al, Sm, Er, or Ho or a fluoride or an oxide thereof, or a material obtained by co-depositing the inorganic material and the organic material for the hole injection layer 166a, defects occurred at 450 times, and in Comparative Example 4, defects occurred at 800 times. In addition, in Comparative Example 1 and Comparative Example 2 which are conventional structures in which the surface roughness Ra of the pixel electrode 164 is not set to 20 nm or more and the PV value is not set to 40 nm or more, defects occurred at 2000 times. Comparing Comparative Example 1 through to Comparative Example 4, the repeated bending strength peeling resistance of Example 1 and Example 2 was significantly improved.

What is claimed is:

1. A display device comprising:
    a pixel electrode, a counter electrode, and an organic layer arranged between the pixel electrode and the counter electrode,
    wherein
    the organic layer includes a hole injection layer in contact with the pixel electrode, a hole transport layer above the hole injection layer, a light emitting layer and an electron transport layer;
    the hole injection layer includes an inorganic material;
    the inorganic material has a work function of 4.4 eV or less,
    a surface roughness of the pixel electrode is 20 nm or more, and a gap length between a projection and a depression of the surface of the pixel electrode is 40 nm or more, and
    a thickness of the hole injection layer is smaller than the surface roughness of the pixel electrode.

2. The display device according to claim 1, wherein the surface of the pixel electrode is indium tin oxide or indium zinc oxide.

3. The display device according to claim 1, wherein the hole injection layer includes the inorganic material and an organic material.

4. The display device according to claim 3, wherein the organic material is an amine-based organic material.

5. The display device according to claim 4, wherein the inorganic material is magnesium fluoride.

6. The display device according to claim 1, further comprising an electron blocking layer arranged between the hole transport layer and the light emitting layer, and a hole blocking layer arranged between the light emitting layer and the electron transport layer.

7. The display device according to claim 1, wherein the pixel electrode is arranged above a first substrate and the first substrate has flexibility.

8. The display device according to claim 7, further comprising a second substrate facing the first substrate and covering the counter electrode;
    wherein the second substrate has flexibility.

9. The display device according to claim 8, further comprising a sealing member is arranged between the first substrate and the second substrate.

10. The display device according to claim 1, wherein the inorganic material includes one element or a plurality of elements selected from Na, Mg, K, Sr, Cs, Ba, Fr, Ca, Rb, Yb, Li, Al, Sm, Er and Ho, or a fluoride or an oxide of these elements.

11. The display device according to claim 1, wherein the thickness of the hole injection layer is 5 nm or less.

* * * * *